(12) United States Patent
Yoshida

(10) Patent No.: US 7,154,171 B1
(45) Date of Patent: Dec. 26, 2006

(54) STACKING STRUCTURE FOR SEMICONDUCTOR DEVICES USING A FOLDED OVER FLEXIBLE SUBSTRATE AND METHOD THEREFOR

(75) Inventor: Akito Yoshida, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 241 days.

(21) Appl. No.: 10/082,472

(22) Filed: Feb. 22, 2002

(51) Int. Cl.
- *H01L 23/48* (2006.01)
- *H01L 23/52* (2006.01)
- *H01L 29/40* (2006.01)

(52) U.S. Cl. ............... 257/688; 257/784; 257/E23.078; 257/E23.055; 257/E23.065; 257/E25.006; 257/E25.03

(58) Field of Classification Search ........... 257/685, 257/686, 688, 723, 724, 777, 778, 693, 700
See application file for complete search history.

(56) References Cited

U.S. PATENT DOCUMENTS

| | | |
|---|---|---|
| 4,763,188 A | 8/1988 | Johnson |
| 5,012,323 A | 4/1991 | Faraworth |
| 5,025,306 A | 6/1991 | Johnson et al. |
| 5,291,061 A | 3/1994 | Ball |
| 5,323,060 A | 6/1994 | Fogal et al. |
| 5,347,429 A | 9/1994 | Kohno et al. |
| 5,375,041 A * | 12/1994 | McMahon .................. 361/749 |
| 5,422,435 A | 6/1995 | Takiar et al. |
| 5,463,253 A | 10/1995 | Waki et al. |
| 5,495,398 A | 2/1996 | Takiar et al. |
| 5,502,289 A | 3/1996 | Takiar et al. |
| 5,583,375 A * | 12/1996 | Tsubosaki et al. .......... 257/692 |
| 5,689,135 A | 11/1997 | Ball |
| 5,696,031 A | 12/1997 | Wark |
| 5,714,405 A * | 2/1998 | Tsubosaki et al. .......... 438/118 |
| 5,715,147 A | 2/1998 | Nagano |
| 5,721,452 A | 2/1998 | Fogal et al. |
| 5,739,581 A | 4/1998 | Chillara et al. |
| 5,747,874 A * | 5/1998 | Seki et al. ................... 257/686 |
| 5,776,797 A * | 7/1998 | Nicewarner et al. ........ 438/107 |
| 5,801,439 A * | 9/1998 | Fujisawa et al. ............ 257/686 |
| 5,805,422 A * | 9/1998 | Otake et al. ................. 361/749 |
| 5,815,372 A | 9/1998 | Gallas |
| 5,841,855 A * | 11/1998 | Davidson et al. ............ 379/396 |
| 5,866,949 A | 2/1999 | Schueller |
| 5,869,888 A * | 2/1999 | Tsubosaki et al. .......... 257/692 |
| 5,886,412 A | 3/1999 | Fogal et al. |
| 5,973,403 A | 10/1999 | Wark |
| 6,005,778 A | 12/1999 | Spielberger et al. |
| 6,013,948 A | 1/2000 | Akram et al. |
| RE36,613 E | 3/2000 | Ball |
| 6,051,886 A | 4/2000 | Fogal et al. |
| 6,057,598 A | 5/2000 | Payne et al. |

(Continued)

FOREIGN PATENT DOCUMENTS

EP        503 201 A2     12/1991

(Continued)

*Primary Examiner*—David A. Zarneke
(74) *Attorney, Agent, or Firm*—Weiss & Moy, P.C.

(57) ABSTRACT

A semiconductor stacking structure has a semiconductor device. A flexible substrate is coupled to a bottom surface of the semiconductor device. The flexible substrate is folded over on at least two sides to form flap portions. The flap portions are coupled to an upper surface of the first semiconductor device and covers only a portion of the upper surface of the semiconductor device.

20 Claims, 3 Drawing Sheets

| U.S. PATENT DOCUMENTS | | | | FOREIGN PATENT DOCUMENTS | | |
|---|---|---|---|---|---|---|
| 6,072,243 | A | 6/2000 | Nakanishi | GB | 56062351 | 5/1981 |
| 6,080,264 | A | 6/2000 | Ball | GB | 60182731 | 9/1985 |
| 6,118,176 | A | 9/2000 | Tao et al. | GB | 61117858 | 6/1986 |
| 6,133,637 | A | 10/2000 | Hikita et al. | GB | 62-126661 | 6/1987 |
| 6,140,149 | A | 10/2000 | Wark | GB | 62126661 | 6/1987 |
| 6,157,080 | A | 12/2000 | Tamaki et al. | GB | 63128736 | 6/1988 |
| 6,163,076 | A | 12/2000 | Lee et al. | GB | 63-244654 | 10/1988 |
| 6,172,418 | B1 * | 1/2001 | Iwase .................. 257/723 | GB | 1028856 | 1/1989 |
| 6,214,641 | B1 | 4/2001 | Akram | GB | 64001269 | 1/1989 |
| 6,215,193 | B1 | 4/2001 | Tao et al. | GB | 1071162 A | 3/1989 |
| 6,225,688 | B1 * | 5/2001 | Kim et al. ............ 257/686 | GB | 1099248 A | 4/1989 |
| 6,252,305 | B1 | 6/2001 | Lin et al. | GB | 3169062 | 7/1991 |
| 6,258,626 | B1 | 7/2001 | Wang et al. | GB | 4028260 | 1/1992 |
| 6,326,696 | B1 | 12/2001 | Horton et al. | GB | 62-56262 | 2/1992 |
| 6,333,562 | B1 | 12/2001 | Lin | GB | 4056262 | 2/1992 |
| 6,351,029 | B1 * | 2/2002 | Isaak .................. 257/688 | GB | 4096358 | 3/1992 |
| 6,359,340 | B1 | 3/2002 | Lin et al. | GB | 4116859 | 4/1992 |
| 6,365,966 | B1 | 4/2002 | Chen et al. | GB | 5013665 | 1/1993 |
| 6,369,331 | B1 * | 4/2002 | Kusano et al. ............ 174/260 | GB | 5-75015 A | 3/1993 |
| 6,376,769 | B1 * | 4/2002 | Chung .................. 174/52.2 | GB | 5109975 | 4/1993 |
| 6,387,728 | B1 | 5/2002 | Pai et al. | GB | 5136323 | 6/1993 |
| 6,461,897 | B1 | 10/2002 | Lin et al. | JP | 4-56262 | 2/1992 |
| 6,486,544 | B1 * | 11/2002 | Hashimoto .......... 257/686 | JP | 10-256470 | 9/1998 |
| 6,869,825 | B1 * | 3/2005 | Chiu .................... 438/106 | | | |
| 6,870,074 | B1 * | 4/2005 | Kim .................... 257/686 | * cited by examiner | | |

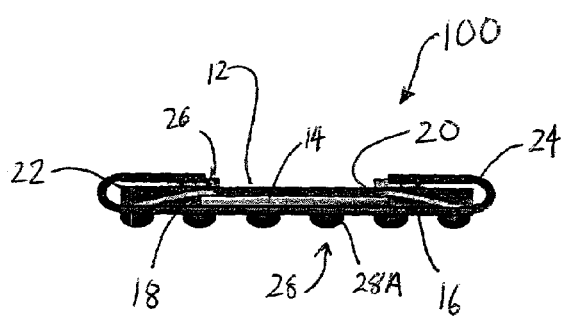
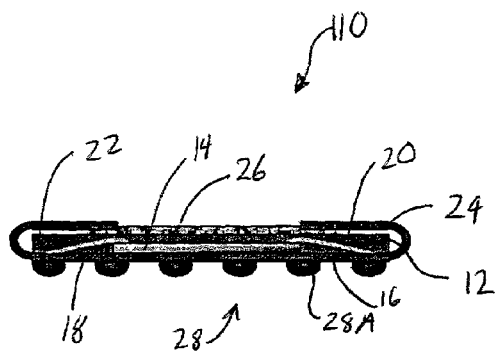
Fig. 1A                                   Fig. 1B
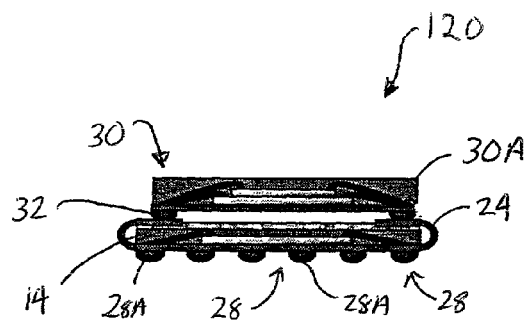
Fig. 2
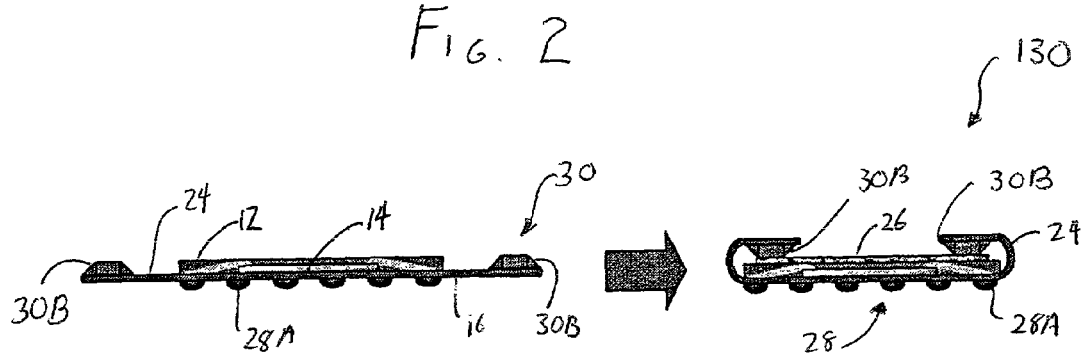
Fig. 3A

STACKING STRUCTURE FOR SEMICONDUCTOR DEVICES USING A FOLDED OVER FLEXIBLE SUBSTRATE AND METHOD THEREFOR

FIELD OF THE INVENTION

This invention relates to semiconductor devices and, more specifically, to a stacking structure for semiconductor devices which uses a folded over flexible substrate and a method therefor.

BACKGROUND OF THE INVENTION

As electronic devices get smaller, the components within these devices must get smaller as well. Because of this, there has been an increased demand for the miniaturization of components and greater packaging density. Integrated Circuit (IC) package density is primarily limited by the area available for die mounting and the height of the package. One way of increasing the density is to stack multiple die or packages vertically in an IC package. Stacking multiple die or packages will maximize function and efficiency of the semiconductor package.

One method of stacking multiple die in an IC package is to use a folded over flexible substrate. In this method, a die and the other die are placed side by side on a flexible substrate. The flexible substrate is then folded over and the portion where the other die is placed covers the entire top surface of the die. In the case of more than two dies, the method is the same.

The above method is the current way of producing IC packages having multiple stacked die using a flexible substrate. However, there are several problems associated with using flexible substrates for producing IC packages having multiple stacked die. One problem is cost. Two metal layer flexible substrate tape is very expensive to use making certain packages cost prohibitive to the end user/client. Second, under current methods, connect density between dies is dramatically lower using a folded over substrate.

Therefore, a need existed to provide a device and method to overcome the above problem.

SUMMARY OF THE INVENTION

A semiconductor package and method of producing the same has a semiconductor device. A flexible substrate is coupled to a bottom surface of the semiconductor device. The flexible substrate is folded over on at least two sides to form flap portions. The flap portions are coupled to an upper surface of the first semiconductor device and covers only a portion of the upper surface of the semiconductor device.

The present invention is best understood by reference to the following detailed description when read in conjunction with the accompanying drawings.

BRIEF DESCRIPTION OF THE DRAWINGS

FIG. 1A is an elevated perspective view of one embodiment of the stacking structure of the present invention;

FIG. 1B is an elevated perspective view of another embodiment of the stacking structure of the present invention;

FIG. 2 is an elevated perspective view of another embodiment of the stacking structure of the present invention;

FIG. 3A is an elevated perspective view of another embodiment of the stacking structure of the present invention;

Common reference numerals are used throughout the drawings and detailed description to indicate like elements.

DETAILED DESCRIPTION

Figure 3B:
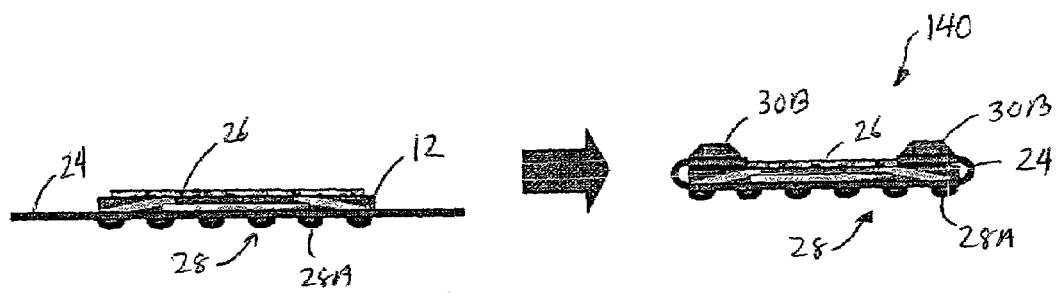
FIG. 3B is an elevated perspective view of another embodiment of the stacking structure of the present invention.

Referring to FIG. 1A, one embodiment of a stacking structure for semiconductor devices using a folded over flexible substrate 100 (hereinafter stacking structure 100) is shown. The stacking structure 100 has a device 12 which is formed on a flexible substrate 16. The device 12 is a fully encapsulated package which has a semiconductor die 14. The semiconductor die 14 may be any type of device. For example, the semiconductor die 14 may be a memory device, a logic device, an ASIC device, and other like elements. It should be noted that the listing of the above types of semiconductor dies 14 is given as an example and should not be seen as to limit the scope of the present invention.

The stacking structure 100 may be a lead type of device, a Ball Grid Array (BGA) type of device, or a Land Grid Array (LGA) type of device In the embodiment depicted in FIG. 1A, the stacking structure 100 is a BGA type of package. However, this should not be seen as to limit the scope of the present invention. A leadframe type of prepackaged device 12 may be used and is described below.

The device 12 is formed on the flexible substrate 16. A semiconductor die 14 is coupled to the flexible substrate 16. An adhesive layer 18 is used to couple the semiconductor device 14 to the flexible substrate 16. The adhesive layer 18 may be an adhesive film, an epoxy, or the like. However, the listing of the above adhesive layers should not be seen as to limit the scope of the present invention. The semiconductor die 14 is then electrically coupled to the flexible substrate 16. In accordance with the embodiment depicted in FIG. 1A, wirebonds 20 are used to electrically couple the semiconductor die 14 to the flexible substrate 16. Alternatively, a flip chip may be used. This will be described below. A mold compound 22 is then used to encapsulate the device 12.

The stacking structure 100 will have two or more flap portions 24 coupled to the device 12. The flap portions 24 are formed by providing an elongated flexible substrate 16. The elongated sections of the flexible substrate 16 are folded over forming the flap portions 24. The flap portions are then coupled to the device 12.

The flexible substrate 16 is generally a flex tape such as a polyamide. The flexible tape will have one or more metal layers which are used for electrical connections. However, this is just one type of flexible substrate 16 and should not be seen as to limit the scope of the present invention.

The flexible substrate 16 is comprised of at least two flap portions 24 which fold and are coupled to an upper surface of the device 12. The flap portions 24 of the flexible substrate 16 are then coupled to an upper surface of the device 12. The flap portions 24 are folded in a manner so that it will cover only a portion of the upper surface of the device 12. The flap portions 24 of the flexible substrate 16 will not over lap or contact each other. Thus, the amount of flexible substrate 16 used is dramatically less than the prior art. Furthermore, by folding the flexible substrate 16 on multiple sides, the device 12 will have twice as much signal density (i.e., I/O paths) than the prior art which is only folded on a single side.

In general, the flap portions 24 of the flexible substrate 16 are coupled to the device 12 using an adhesive 26. In the embodiment depicted in FIG. 1A, a small amount of adhesive 26 is used to connect each end of the flap portion 24 to the upper surface of the device 12. The adhesive 26 may be an epoxy adhesive which can be either electrically or non-electrically conductive. The adhesive 26 may be an adhesive tape, a paste, a thermoplastic adhesive, or the like.

Electrical contacts 28 are then coupled to the flexible substrate 16. The electrical contacts 28 are used provide an electrical connection to the stacking structure 10. The electrical contacts 28 may be a plurality of solder balls 28A as shown in FIG. 1A or a plurality of leads as will be discussed below.

Referring now to FIG. 1B, another embodiment of the present invention is shown. In this embodiment, the stacking structure 110 is similar to that shown in FIG. 1A. The main difference is that the adhesive 26 covers a greater area on the upper surface of the device 12.

Referring now to FIG. 2, another embodiment of the present invention is shown. In this embodiment, the stacking structure 120 is similar to that shown in FIGS. 1A and 1B. However, in this embodiment, a second device 30 is coupled to the flap portion 24 of the flexible substrate 16, which is coupled to the upper section of the device 12. The second device 30 may be a die (i.e., flip chip) or another prepackaged device. In the embodiment depicted in FIG. 2, the second device 30 is a prepackaged device 30A. The prepackaged device 30A will have contacts 32 which will be coupled to the flap portions 24. The contacts 32 may be solder balls, solder paste, leads, or the like. The listing of the different contacts 32 should not be seen as to limit the scope of the present invention. The type of contacts will depend on the type of prepackaged device 30A that is being used (i.e., BGA, leadframe, etc.). The prepackaged device 30A will be coupled to the flap portions 24 of the flexible substrate 16 by soldering method. It should be noted that additional devices may be stacked on top of the second device 30.

Referring now to FIG. 3A, another embodiment of the present invention is shown. In this embodiment, the stacking structure 130 is similar to that shown in the previous embodiments. The main difference is that one or more devices 30B are coupled to the flap portion 24 of the flexible substrate 16. The devices 30B may be any type of device. However, a memory device or a passive chip component such as a capacitor is generally used. In FIG. 3A, the device 30B is coupled to the flap portion 24 of the flexible substrate 16 prior to the flap portion 24 being folded over and coupled to the device 12. The device 30B may be coupled to the device 12 in a plurality of different ways. In general, some type of adhesive similar to that previously described is used. The device 30B is first coupled to the flap portion 24 of the flexible substrate 16. Solder is generally used to couple the devices 30B to the flap portions 24, however, other means known to those skilled in the art of semiconductor packaging could be used to couple the devices 30B to the flap portion 24, such as flip chip bonding or anisotropic conductive film (ACF). The adhesive layer 26 is then placed on the upper surface of the device 12. The flap portion of the flexible substrate 24 is then folded so that the die 30B is coupled to the prepackaged device 12. It should be noted that additional devices could be mounted on top of the flap portion 24 of the flexible substrate 16.

Referring now to FIG. 3B, another embodiment of the present invention is shown. In this embodiment, the stacking structure 140 is similar to that shown in FIG. 3A. The main difference is that the flap portion 24 of the flexible substrate 16 is first folded and coupled to the device 12 by means of the adhesive layer 26. The devices 30B are then coupled to the flap portions 24. Solder is generally used to couple the devices 30B to the flap portions 24, however, other means known to those skilled in the art of semiconductor packaging could be used to couple the devices 30B to the flap portion 24, such as flip chip bonding or anisotropic conductive film (ACF). Again, like in FIG. 3A, addition die or semiconductor devices could be mounted on top of the dies 30B.

Figure 4:
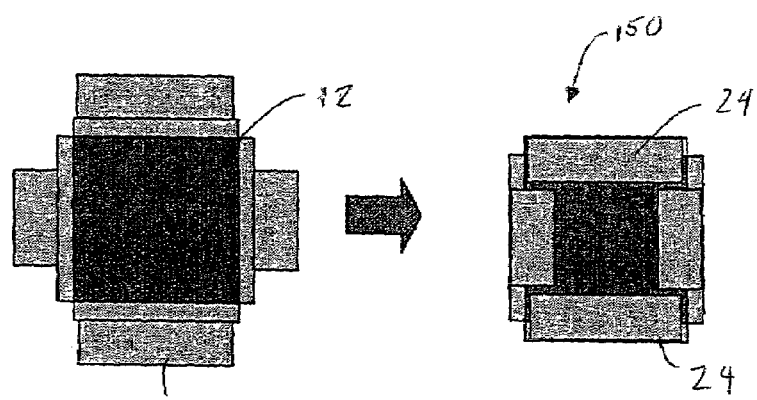
FIG. 4 is a top view of another embodiment of the stacking structure of the present invention.

Referring now to FIG. 4, another embodiment of the present invention is shown. In this embodiment, the stacking structure 150 is similar to that shown in FIGS. 1A and 1B. The main difference is that the flap portions 24 are folded along four sides of the device 12. Like the embodiments depicted in FIGS. 1A and 1B, the adhesive layer 26 may be located only on the flap portions 26 which are in contact with the device 12 or the adhesive layer 26 may cover the upper surface of the device 12. By folding the flap portions 24 on four sides, the device 12 will have four times as much signal density (I/O paths) than the prior art which is only folded on a single side. In order to fold the flexible substrate 16 on four sides, adjoining flap portions 24A should be partially cut to narrow the size of the adjoining flap portions 24A. The adjoining flap portions 24A need to be cut so that when the flap portions 24 and the adjoining flap portions 24A are folded, they will not over lap one another or contact each other.

Figures 5A, 5B:
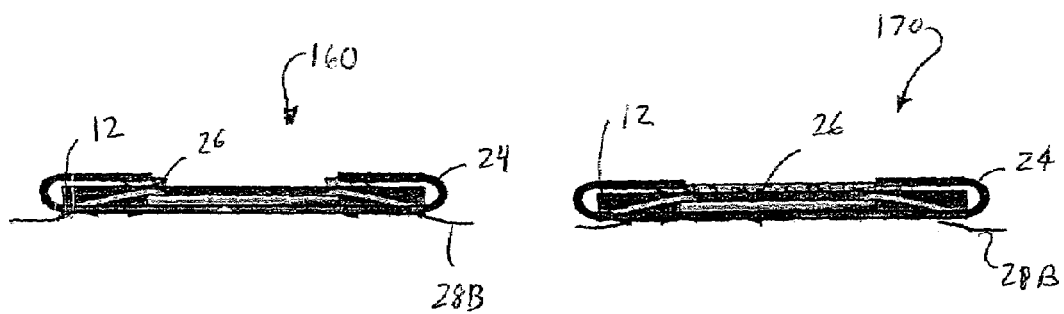
FIG. 5A is an elevated perspective view of another embodiment of the stacking structure of the present invention.
FIG. 5B is an elevated perspective view of another embodiment of the stacking structure of the present invention.

Referring now to FIG. 5A, another embodiment of the present invention is shown. In this embodiment, the stacking structure 160 is similar to that shown in FIG. 1A. The main difference is that the contacts 28 in the stacking structure 160 are leads 28B. The leads 28B may be connected in a plurality of different manners. For example, the leads 28B may be connected by a process such as the connection of outer leads in Tape Automated Bonding (TAB).

Referring now to FIG. 5B, another embodiment of the present invention is shown. In this embodiment, the stacking structure 170 is similar to that shown in FIG. 1B. The main difference is that the contacts 28 are leads 28B. The leads 28B may be connected in a plurality of different manners. For example, the leads 28B may be connected by a process such as the connection of outer leads in Tape Automated Bonding (TAB).

Figure 5C:
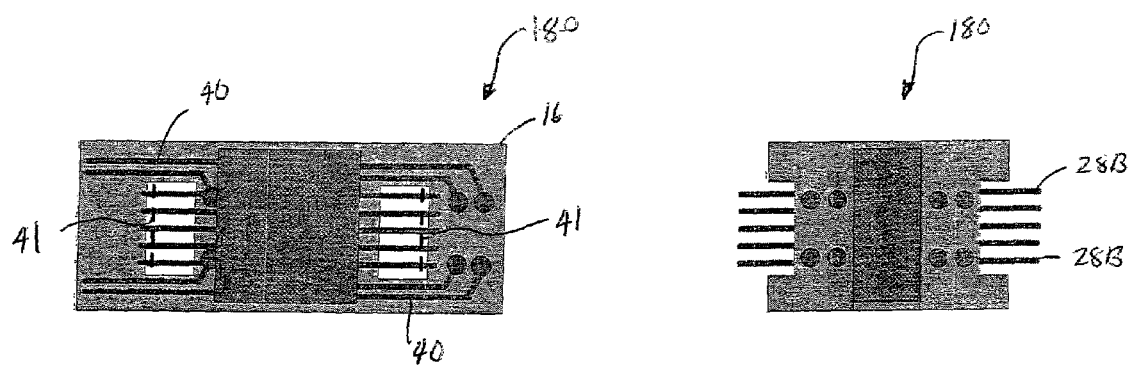
FIG. 5C is a top view of the stacking structures depicted in FIGS. 5A and 5B.

Referring now to FIG. 5C, a top view of an exemplary stacking structure 160 or 170 having leads 28B is shown. In the embodiment depicted in FIG. 5C, the flexible substrate 16 has a plurality of traces 40 formed thereon. One or more apertures 41 are made in the flexible substrate 16. The apertures 41 are used to allow some of the traces 40 to be used as leads 28B. The apertures 41 allow the traces 40 to be exposed thereby forming leads 26B to be used for connections to an external device such as a mother board or other types of circuit boards. The flexible substrate 16 is then folded to form the flap portions 26. The traces 40 are not shown since they run inside the flexible substrate 16.

Figure 6:
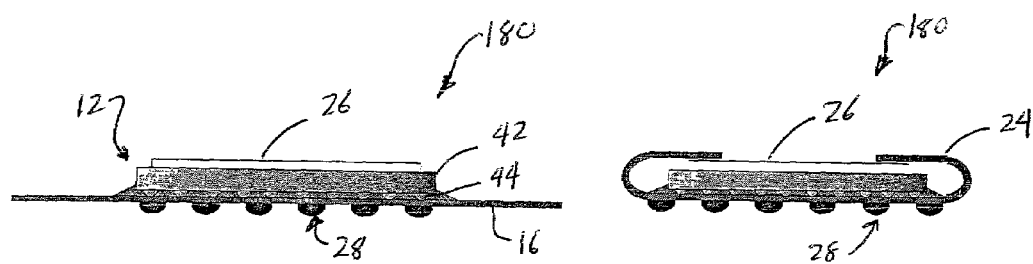
FIG. 6 is an elevated perspective view of another embodiment of the stacking structure of the present invention.

Referring now to FIG. 6, another embodiment of the present invention is shown. In this embodiment, the stacking structure 180 is similar to the above embodiments. The main difference is that the device 12 is a flip chip 42. The flip chip 42 has a plurality of bumps 44 formed thereon. The bumps 44 may be formed by different processes. For example, a wafer bumping process may be used. The bumps are generally formed of solder, gold, or other like materials. It should be noted that the listing of the above materials should not be seen as to limit the scope of the present invention. The flip chip 42 is coupled to the flexible substrate 16 by a flip chip process. A resin, film, or like material may be used for bump protection to protect against mechanical stress. The flap portion 24 is then folded over and coupled to an upper surface of the flip chip 42. An adhesive 26 is used to couple the flap portion 24 to the upper surface of the flip chip 42. Like the embodiments depicted in FIGS. 1A and 1B, the adhesive layer 26 may be located only on the flap portions 26 which are in contact with the flip chip 42 or the adhesive layer 26 may cover the upper surface of the flip chip 42.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor stacking structure comprising:
   a semiconductor die;
   a flexible tape substrate having at least one metal layers for electrical connections wherein the flexible tape substrate is coupled to a bottom surface of the semiconductor die;
   wirebonds for electrically coupling the semiconductor die to the metal layer; and
   an encapsulant covering the semiconductor die and the wirebonds;
   wherein the flexible tape substrate further comprises a plurality of flap portions and each flap portion is folded along a side surface and an upper surface of the encapsulant;
   wherein the flap portions do not over lap one another and cover only a portion of the upper surface of the encapsulant;
   wherein the folded flap portions have an exposed metal layer.

2. A semiconductor stacking structure in accordance with claim 1 further comprising an adhesive layer which is placed on the flap portions of the flexible tape substrate and which couples the flap portions to the upper surface of the encapsulant.

3. A semiconductor stacking structure in accordance with claim 1 further comprising an adhesive layer which is placed on the upper surface of the encapsulant and which couples the flap portions to the encapsulant.

4. A semiconductor stacking structure in accordance with claim 1 further comprising a semiconductor device coupled to the flap portions of the flexible tape substrate.

5. A semiconductor stacking structure in accordance with claim 4 wherein the semiconductor device is coupled to the flap portions of the flexible tape substrate after the flap portions are folded over and coupled to the encapsulant.

6. A semiconductor stacking structure in accordance with claim 4 wherein the semiconductor device is coupled to the flap portions of the flexible tape substrate before the flap portions are folded over and coupled to the encapsulant.

7. A semiconductor stacking structure in accordance with claim 1 wherein the semiconductor stacking structure is a LGA (Land Grid Array) device.

8. A semiconductor stacking structure in accordance with claim 1 wherein the semiconductor stacking structure is a BGA (Ball Grid Array) device.

9. A semiconductor stacking structure in accordance with claim 1 wherein the semiconductor stacking structure is a lead type of device.

10. A semiconductor stacking structure in accordance with claim 1 wherein the flexible tape substrate is folded over on four sides to form flap portions which are coupled to the upper surface of the encapsulant and covers only a portion of the upper surface of the encapsulant.

11. A semiconductor stacking structure comprising:
    a semiconductor die;
    means for interconnection having at least one metal layer for electrical connections coupled to a bottom surface of the semiconductor die;
    wirebonds for electrically coupling the semiconductor die to the metal layer; and
    an encapsulant covering the semiconductor die and the wirebonds;
    wherein the interconnection means further comprises a plurality of flap portions and each flap portion is folded along a side surface and an upper surface of the encapsulant;
    wherein the flap portions do not over lap one another and cover only a portion of the upper surface of the encapsulant;
    wherein the folded flap portions have an exposed metal layer.

12. A semiconductor stacking structure in accordance with claim 11 further comprising an adhesive layer placed on the means for coupling the interconnection means to the upper surface of the encapsulant.

13. A semiconductor stacking structure comprising:
    a semiconductor die;
    means for interconnection having at least one metal layer for electrical connections coupled to a bottom surface of the semiconductor die;
    wirebonds for electrically coupling the semiconductor die to the metal layer; and
    an encapsulant covering the semiconductor die and the wirebonds;
    wherein the interconnection means further comprises at least four flap portions and each flap portion is folded along a side surface and an upper surface of the encapsulant;
    wherein the flap portions do not over lap one another and cover only a portion of the upper surface of the encapsulant;
    wherein the folded flap portions have an exposed metal layer.

14. A semiconductor stacking structure in accordance with claim 13 further comprising means placed on the flap portions of the flexible substrate for coupling the flap portions to the encapsulant.

15. A semiconductor stacking structure in accordance with claim 13 further comprising means placed on the upper surface of the encapsulant for coupling the flap portions to the encapsulant.

16. A semiconductor stacking structure in accordance with claim 13 further comprising a semiconductor device coupled to the flap portions of the coupling means.

17. A semiconductor stacking structure in accordance with claim 16 wherein the semiconductor device is coupled to the flap portions of the coupling means after the flap portions are folded over and coupled to the encapsulant.

18. A semiconductor stacking structure in accordance with claim 16 wherein the semiconductor device is coupled to the flap portions of the coupling means before the flap portions are folded over and coupled to the encapsulant.

19. A semiconductor stacking structure in accordance with claim 1 further comprising an adhesive for coupling the semiconductor die to the flexible tape substrate.

20. A semiconductor stacking structure in accordance with claim 11 further comprising an adhesive for coupling the semiconductor die to the means.

* * * * *